(12) United States Patent
Lin et al.

(10) Patent No.: US 12,510,304 B2
(45) Date of Patent: Dec. 30, 2025

(54) HEAT DISSIPATION DEVICE

(71) Applicant: ASIA VITAL COMPONENTS CO., LTD., New Taipei (TW)

(72) Inventors: Sheng-Huang Lin, New Taipei (TW); Yuan-Yi Lin, New Taipel (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 217 days.

(21) Appl. No.: 18/064,289

(22) Filed: Dec. 12, 2022

(65) Prior Publication Data
US 2023/0243596 A1    Aug. 3, 2023

(30) Foreign Application Priority Data
Jan. 28, 2022    (TW) .................................. 111103921

(51) Int. Cl.
| | |
|---|---|
| *F28D 15/02* | (2006.01) |
| *F28F 3/04* | (2006.01) |
| *H05K 7/20* | (2006.01) |

(52) U.S. Cl.
CPC .......... *F28D 15/0275* (2013.01); *F28F 3/048* (2013.01); *H05K 7/20336* (2013.01)

(58) Field of Classification Search
CPC ... F28D 15/0275; F28F 3/048; H05K 7/20336
See application file for complete search history.

(56) References Cited

U.S. PATENT DOCUMENTS 5,219,020 A  *  6/1993  Akachi ............... F28D 15/0266
                                                    165/104.29
5,527,628 A  *  6/1996  Anderson ............ B23K 35/262
                                                    228/262.9

(Continued)

FOREIGN PATENT DOCUMENTS

CN    2746530 Y    12/2005
CN    101896049 A    11/2010
(Continued)

OTHER PUBLICATIONS

Search Report dated Jun. 5, 2024 issued by China National Intellectual Property Administration for counterpart application No. 2022101039319.

(Continued)

*Primary Examiner* — Gordon A Jones
(74) *Attorney, Agent, or Firm* — Bradley J. Thorson; DeWitt LLP

(57) ABSTRACT

A heat dissipation device includes an aluminum base seat and any or both of at least one copper two-phase fluid component and a copper heat conduction component. The aluminum base seat has an upper face and a lower face. A connection section is formed on the lower face and a copper embedding layer is disposed on the connection section. Any or both of the copper two-phase fluid component and the copper heat conduction component are disposed on the connection section and connected with the copper embedding layer. By means of the copper embedding layer disposed on the connection section, the aluminum base seat can be directly welded and connected with the copper two-phase fluid component and/or the copper heat conduction component made of heterogeneous metal materials without chemical nickel treatment procedure.

5 Claims, 3 Drawing Sheets

(56) References Cited

U.S. PATENT DOCUMENTS

| | | | |
|---|---|---|---|
| 2010/0126700 A1 | 5/2010 | Chen | |
| 2012/0067550 A1* | 3/2012 | Shih | H01L 23/427 |
| | | | 165/104.21 |
| 2012/0312508 A1* | 12/2012 | Shen | H01L 23/467 |
| | | | 29/890.032 |
| 2012/0318480 A1* | 12/2012 | Lin | F28D 15/0233 |
| | | | 29/890.03 |
| 2023/0241728 A1* | 8/2023 | Lin | B23P 15/26 |
| | | | 29/890.054 |
| 2023/0243594 A1* | 8/2023 | Chen | F28D 15/0233 |
| | | | 165/104.21 |
| 2023/0243595 A1* | 8/2023 | Lin | F28F 9/268 |
| | | | 165/104.21 |
| 2023/0243607 A1* | 8/2023 | Lin | F28D 15/0275 |
| | | | 165/104.21 |

FOREIGN PATENT DOCUMENTS

| | | |
|---|---|---|
| CN | 110849190 A | 2/2020 |
| CN | 216820486 U | 6/2022 |
| TW | 201038911 A | 11/2010 |
| TW | 201305525 A | 2/2013 |
| TW | M517812 U | 2/2016 |
| TW | M627124 U | 5/2022 |

OTHER PUBLICATIONS

Search Report dated Oct. 20, 2022 issued by Taiwan Intellectual Property Office for counterpart application No. 111103921.

* cited by examiner

HEAT DISSIPATION DEVICE

This application claims the priority benefit of Taiwan patent application number 111103921 filed on Jan. 28, 2022.

BACKGROUND OF THE INVENTION

1. Field of the Invention

The present invention relates generally to a heat dissipation device, and more particularly to a heat dissipation device including an aluminum base seat, at least one copper two-phase fluid component and a copper heat conduction component. The aluminum base seat has a connection section. A copper embedding layer is disposed on the connection section of the aluminum base seat to be connected. By means of the copper embedding layer disposed on the connection section, the aluminum base seat can be directly welded and connected with the copper two-phase fluid component and/or the copper heat conduction component made of heterogeneous metal materials without chemical nickel treatment procedure.

2. Description of the Related Art

The conventional heat sink or thermal module is generally made of copper or aluminum material. Copper has a property of high heat conductivity so that in the conventional heat sink or thermal module, the heat dissipation base seat is often selectively made of copper material for conducting the heat generated by an execution unit (such as central processing unit, graphics processing unit or other transistor or other heat source) and dissipating the heat by heat exchange. However, in the case that the heat sink or thermal module is entirely made of copper material, the heat sink or thermal module will have a quite heavy weight and the cost is very high. Therefore, in the current manufacturing method, the components in direct contact with the heat source to absorb the heat of the heat source, (such as the heat conduction unit (heat conduction component, heat conduction body, heat conduction seat), copper plate, two-phase fluid component (such as heat pipe, vapor chamber, etc.)), are made of copper material, while the other components (such as radiating fin assembly, radiating fins, heat sink or heat dissipation seat) are selectively made of relatively lightweight aluminum material at lower cost so as to reduce the weight and lower the cost.

For example, with respect to the conventional extruded aluminum heat sink, in order to achieve better heat conduction effect, the bottom of the extruded aluminum heat sink is often directly connected with at least one copper heat pipe or vapor chamber with better heat conductivity. Alternatively, the bottom of the extruded aluminum heat sink is formed with a channel to facilitate the installation of the copper heat pipe or vapor chamber. A cooperative copper plate is further overlaid on any of the copper heat pipe or vapor chamber to contact the heat source.

The surface of the extruded aluminum heat sink is easy to oxidize to produce oxide ($AlO_3$) of high melting point in the welding process. The oxide ($AlO_3$) will directly hinder the aluminum material from being fused with copper metal. Therefore, it is difficult to weld the aluminum material with the copper material. In the case that the copper material is directly welded with the aluminum material, after welded, the directly welded sections of the two materials of copper and aluminum are apt to fissure due to great fragility. In addition, when the copper material is fused and welded with the aluminum material, eutectic structures such as $CuAl_2$ are quite easy to form in the welding seam near the copper material side. In addition, the eutectic structures of $CuAl_2$, etc. are distributed over the grain boundaries of the material and easy to cause the problem of fatigue or fissure between the grain boundaries. Moreover, the melting points and eutectic temperatures of copper metal and aluminum metal are greatly different from each other. Therefore, in the fusion and welding operation, when the surface of aluminum metal is fully molten, the copper material still keeps in solid state. Reversely, when copper metal is molten, too much aluminum metal has been molten so that they cannot coexist in a co-fused or eutectic state. This increases difficulty in welding of copper metal and aluminum metal. Furthermore, pores are easy to produce at the welding seam. This is because the copper and aluminum both have very good heat conductivity. When welded, the metal in the molten pool will quickly crystallize. As a result, the metallurgy reaction gas at high temperature cannot escape in time so that pores are easy to produce. Due to the above factors, the contact face of the extruded aluminum heat sink can be hardly directly welded with the copper heat pipe and/or copper plate.

In order to solve the above problem and other problems derived from the above problem that the extruded aluminum heat sink can be hardly directly welded with the copper heat pipe and/or copper plate made of heterogeneous metal materials, the manufacturers employ such a method that the surface of the extruded aluminum heat sink in contact with the copper heat pipe and/or copper plate is treated and modified to facilitate the welding of the heterogeneous metal materials. That is, a chemical nickel coating is previously formed on the bottom section and inner face of the channel or the corresponding connection/contact face of the extruded aluminum heat sink. Via the chemical nickel coating, the heterogeneous metal materials (aluminum and copper) are welded with each other. Currently, those who are skilled in this field employ electroless nickel plating as a technique for modifying the surface of the metal material. The electroless nickel plating provides a unique deposit property including uniformity of the deposit in the deep depression, perforation and blind hole. The electroless nickel plating is also termed "chemical deposition" or "autocatalytic plating". According to the content of phosphorus, the electroless nickel plating can be classified into three types: low phosphorus, middle phosphorus and high phosphorus. The electroless nickel plating is most different from the electroplating in that the electroless nickel plating is performed in a working environment without current. The metal irons are reduced by means of the reducing agent in the solution and the surface of the test piece must be catalyzed prior to electroless nickel plating.

The above method can solve the welding problem of the aluminum base seat and the copper heat conduction component. However, the above method leads to environmental protection problem and other problems. This is because it is necessary to use a great amount of chemical reaction liquid in the electroless nickel plating (chemical deposition) process. In addition, after the electroless nickel plating process, a great amount of industrial waste liquid containing heavy metal or chemical material will be produced. Such industrial waste liquid will produce a great amount of waste water containing toxic material such as yellow phosphorus. The yellow phosphorus waste water contains yellow phosphorus of a concentration ranging from 50 mg/L to 390 mg/L. Yellow phosphorus is a hypertoxic material and is greatly harmful to the organs of human body, such as the liver. After a long period of drinking water containing yellow phosphorus, a human will suffer from the lesions of osteoporosis, necrosis of mandibular bone, etc. Therefore, currently, due to awareness of environmental protection, all countries have started to prohibit electroless nickel plating and relevant manufacturing processes and strenuously promoted non-toxic manufacturing process so as to protect the environment. Also, currently, the global supply chain of nickel and phosphorus materials used in the electroless nickel plating process is unstable and seriously short of nickel and phosphorus materials. This also leads to increase of the cost as a whole.

It is therefore tried by the applicant to provide a heat dissipation device, in which the two heterogeneous metal materials can be still welded and connected with each other without surface modification treatment.

SUMMARY OF THE INVENTION

It is therefore a primary object of the present invention to provide a heat dissipation device including an aluminum base seat and a copper two-phase fluid component and/or a copper heat conduction component. The aluminum base seat has a connection section and a copper embedding layer is disposed on the connection section. By means of the copper embedding layer, the aluminum base seat and the copper two-phase fluid component and/or the copper heat conduction component made of heterogeneous metal materials can be directly welded with each other without surface modification. Therefore, the cost for the heat dissipation device is effectively lowered and the object of environmental protection is achieved.

To achieve the above and other objects, the heat dissipation device of the present invention includes an aluminum base seat having an upper face and a lower face. A connection section is formed on the lower face. A copper embedding layer is disposed on the connection section. Any or both of at least one copper two-phase fluid component and a copper heat conduction component are disposed on the connection section and connected with the copper embedding layer by means of mechanical processing.

In addition, at least one receiving channel is formed on the lower face. The connection section is selectively disposed on receiving channel and/or the lower face. The copper two-phase fluid component is embedded (inlaid or implanted) in the receiving channel. The copper two-phase fluid component and/or the copper heat conduction component are respectively securely connected with the copper embedding layer of the receiving channel and the lower face.

The copper embedding layer is connected and formed on the connection section by means of mechanical processing or surface treatment or chemical processing. The aluminum base seat is made of aluminum material or aluminum alloy material. The copper heat conduction component and the copper embedding layer of the connection section are made of the same copper material. The copper heat conduction component and the aluminum base seat are made of heterogeneous metal materials.

The copper embedding layer has an embedding face and a surface contact face. The surface contact face is connected on the connection section, while the embedding face is embedded in the connection section.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
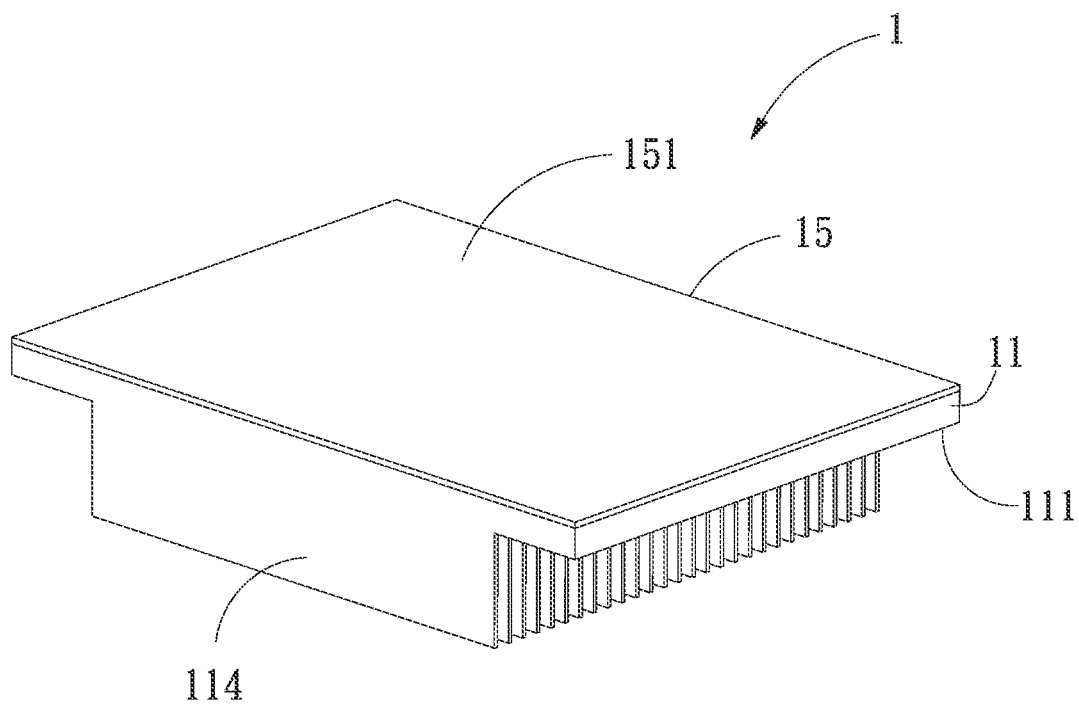
FIG. 1 is a perspective exploded view of the present invention.
Figure 2:
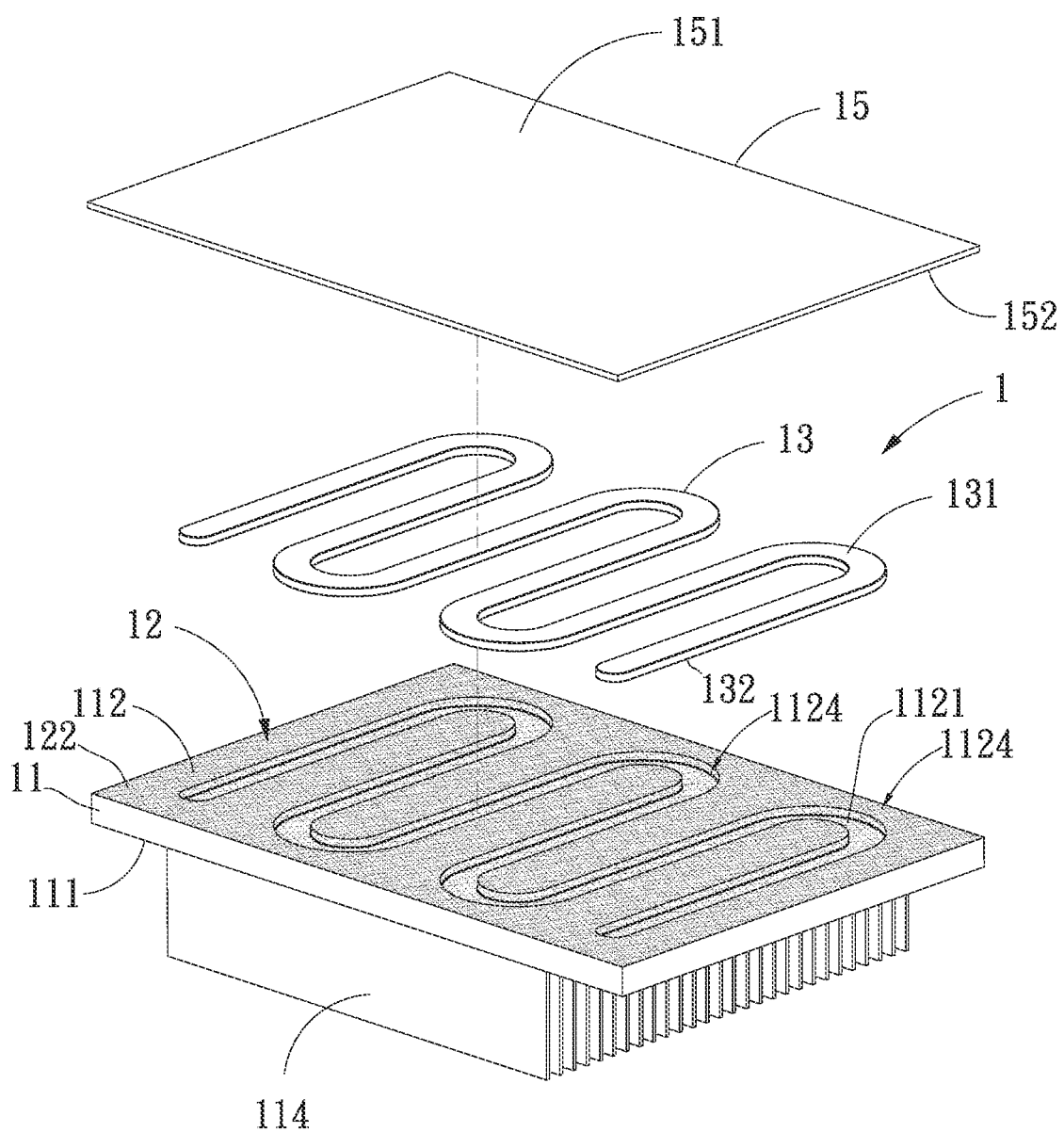
FIG. 2 is a perspective assembled view of the present invention.
Figure 3:
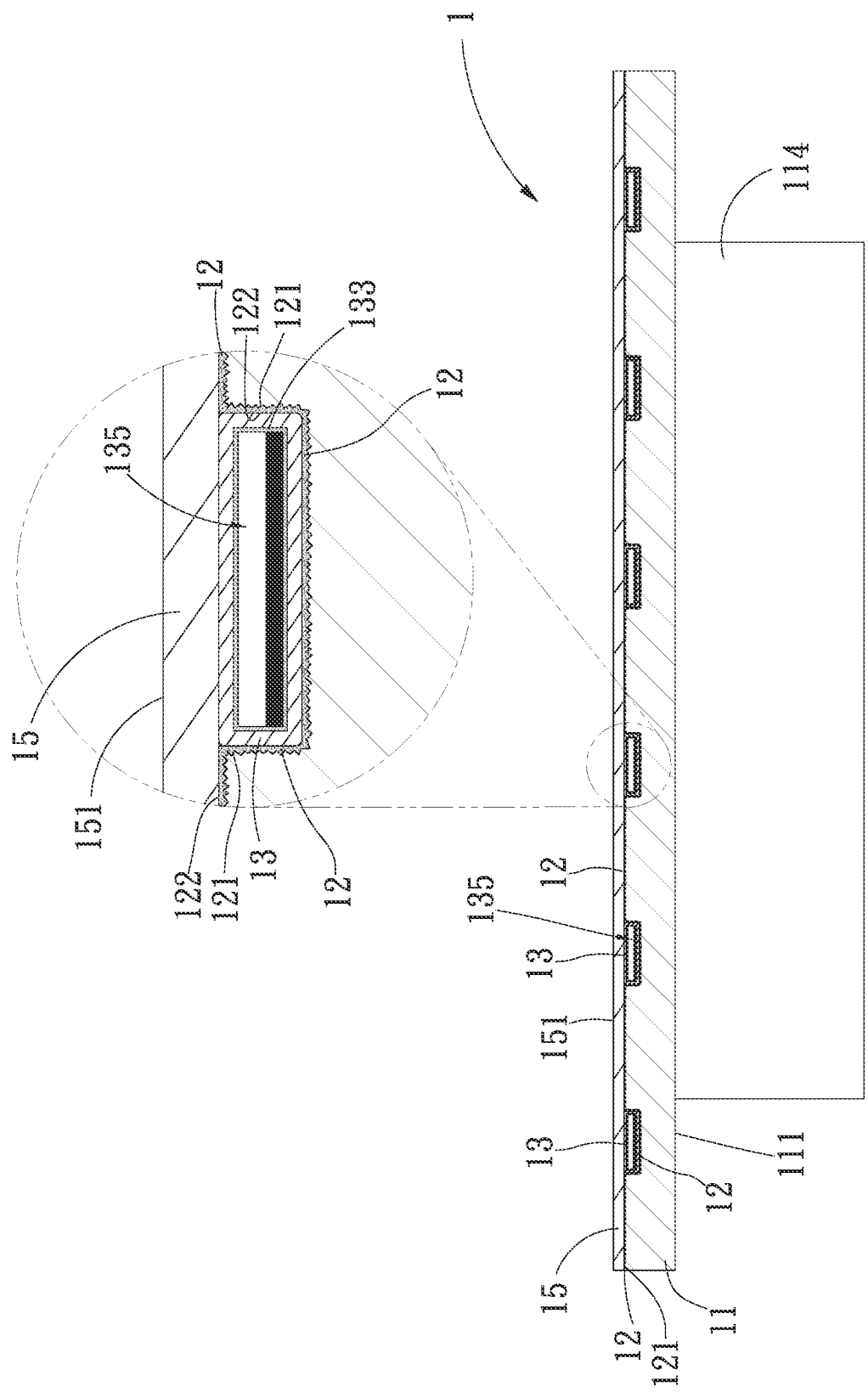
FIG. 3 is a sectional view of the present invention according to FIG. 2.

Please refer to FIGS. 1, 2 and 3. The heat dissipation device 1 of the present invention includes an aluminum base seat 11, at least one copper two-phase fluid component 13 and a copper heat conduction component 15. The aluminum base seat 11 is made of aluminum or aluminum alloy. In this embodiment, the aluminum base seat 11 is made of aluminum and has an upper face 111 and a lower face 112. Multiple aluminum-made radiating fins 114 outward protrude from the upper face 111 and are arranged at intervals. (Alternatively, a radiating fin assembly is additionally mounted on the upper face 111). The radiating fins 114 and the aluminum base seat 11 together form a heat sink (such as extruded aluminum heat sink).

The lower face 112 of the aluminum base seat 11 has at least one receiving channel 1121. A connection section 1124 is selectively simply disposed in the receiving channel 1121 of the lower face 112 or selectively disposed on the entire lower face 112 as well as in the receiving channel 1121. In this embodiment, the connection section 1124 is selectively disposed on the lower face 112 as well as in the receiving channel 1121 for illustration. The receiving channel 1121 is recessed from the lower face 112 to the upper face 111 of the aluminum base seat 11 and is radially (horizontally) windingly disposed on the lower face 112 for receiving the copper two-phase fluid component 13. In practice, there are multiple receiving channels 1121 with a configuration selected from a group consisting of S shape, U shape, L shape, 8 shape, rectangular shape or a combination thereof.

A copper embedding layer 12 is disposed on the connection section 1124. In this embodiment, the copper embedding layer 12 is disposed on the lower face 112 as well as the receiving channel 1121 of the aluminum base seat 11. The copper embedding layer 12 has an embedding face 121 and surface contact face 122 (for welding and connection). The surface contact face 122 serves as an exposed surface of the copper embedding layer 12 and is flush with the surfaces of the lower face 112 and the receiving channel 1121. The embedding face 121 of the copper embedding layer 12 is embedded and connected (such as engaged or inlaid) in the lower face 112 and the receiving channel 1121. (That is, the embedding face 121 is tightly bonded or engaged with the lower face 112 and the receiving channel 1121). The copper embedding layer 12 is selected from a group consisting of copper powder, copper foil, copper sheet and liquid copper. The copper embedding layer 12 is connected on the lower face 112 and the receiving channel 1121 by means of mechanical processing (such as pneumatic pressing, hydraulic pressing, punching, oil pressing or extrusion) or surface treatment (such as spraying or printing) or chemical processing (such as electroplating or anode treatment). In the connection and forming procedure, a part of the copper embedding layer 12 is directly engaged or inlaid in the lower face 112 and the receiving channel 1121 and deposited to form the embedding face 121 so as to enhance the connection force (connection strength) of the copper embedding layer 12. Accordingly, the copper embedding layer 12 is prevented from peeling (detaching) from the lower face 112 and the receiving channel 1121.

When the copper two-phase fluid component 13 is connected with the aluminum base seat 11, the copper two-phase fluid component 13 is entirely embedded in the receiving channel 1121 and connected with the copper embedding layer 12 of the receiving channel 1121 (by means of such as welding). The copper two-phase fluid component 13 has a configuration in adaptation to the configuration of the receiving channel 1121. In practice, the number and configuration of the copper two-phase fluid component 13 are adapted to the number and configuration of the receiving channel 1121. In addition, the copper two-phase fluid component 13 and the aluminum base seat 11 are made of heterogeneous metal materials.

Also, the copper two-phase fluid component 13 is such as a heat pipe or a vapor chamber. In this embodiment, the copper two-phase fluid component 13 is, but not limited to, a heat pipe embedded in the receiving channel 1121 for illustration. Alternatively, the copper two-phase fluid component 13 can be a vapor chamber disposed on the lower face 112 or in the receiving channel 1121. The copper two-phase fluid component 13 has a chamber 135, in which a working fluid (such as pure water) is filled. A capillary structure 133 (such as sintered powder body, channel, mesh body, fiber, braid body or any combination thereof) is disposed on inner wall of the chamber 135. The copper two-phase fluid component 13 has a two-phase fluid contact face 131 and a two-phase fluid connection face 132. The two-phase fluid connection face 132 is connected with (such as welded with) the copper embedding layer 12 in the receiving channel 1121. The two-phase fluid contact face 131 is flush with (or is raised from or recessed from) the lower face 112 of the aluminum base seat 11. The two-phase fluid contact face 131 serves to absorb heat and conduct the heat to the entire copper two-phase fluid component 13. Then the copper two-phase fluid component 13 quickly and uniformly conducts the heat to the aluminum base seat 11. Please further refer to FIGS. 1 and 3. The copper heat conduction component 15 is a copper plate body (such as copper substrate). In this embodiment, the copper heat conduction component 15 and the copper embedding layer 12 are made of the same metal material. The copper heat conduction component 15 and the aluminum base seat 11 are made of different metal materials, (that is, heterogeneous metal materials). The copper heat conduction component 15 has a heat absorption face 151 and a heat conduction face 152. The heat conduction face 152 is welded and connected with the copper embedding layer 12 of the lower face 112 of the aluminum base seat 11 and the two-phase fluid contact face 131 of the copper two-phase fluid component 13.

The heat absorption face 151 of the copper heat conduction component 15 is attached to a heat generation component (such as a central processing unit, a graphics processing unit or any other heat source). The heat absorption face 151 of the copper heat conduction component 15 serves to absorb the heat generated by the heat generation component and conduct the heat to the heat conduction face 152. Then the copper embedding layer 12 conducts the heat to the aluminum base seat 11. Thereafter, the multiple radiating fins 114 on the upper face 111 of the aluminum base seat 11 quickly dissipate the heat outward.

In a modified embodiment, the connection section 1124 is selectively disposed on any of the lower face 112 and the receiving channel 1121 and the copper embedding layer 12 is disposed on any of the lower face 112 and the receiving channel 1121.

The copper embedding layer 12 is disposed on the connection section 1124 of the aluminum base seat 11 to be connected. Accordingly, the aluminum base seat 11 can be directly welded and connected with the copper two-phase fluid component 13 and/or the copper heat conduction component 15 made of heterogeneous metal materials without chemical nickel treatment procedure. Therefore, not only the cost is effectively lowered, but also the object of environmental protection is achieved. Moreover, the problem of lack in nickel and phosphorus is solved.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation device comprising:
an aluminum base seat having an upper face and a lower face, a connection section being defined on the lower face;
a copper embedding layer being disposed on the connection section with a direct copper-to-aluminum metallurgical bond, the copper embedding layer having an embedding face and a surface contact face, the surface contact face facing outward from the connection section, and the embedding face being inlaid in the connection section, wherein the copper embedding layer is formed by mechanical processing, surface treatment, or chemical processing to ensure structural integrity with the aluminum base seat; and
a copper two-phase fluid component disposed in the connection section, where, by means of the copper embedding layer disposed on the connection section, the copper two-phase fluid component is directly welded and connected with the aluminum base seat without chemical nickel treatment.

2. The heat dissipation device as claimed in claim 1, wherein the lower face has at least one receiving channel and the connection section is disposed in the receiving channel, the copper two-phase fluid component being a heat pipe embedded in the receiving channel, the copper two-phase fluid component being connected with the copper embedding layer in the receiving channel.

3. The heat dissipation device as claimed in claim 2, further comprising a copper heat conduction component, the copper heat conduction component having a heat conduction face connected with the copper embedding layer of the lower face and one face of the copper two-phase fluid component.

4. The heat dissipation device as claimed in claim 1, wherein the copper embedding layer is connected and formed on the connection section by means of mechanical processing, surface treatment or chemical processing.

5. The heat dissipation device as claimed in claim 1, wherein multiple radiating fins are disposed on the upper face of the aluminum base seat.

* * * * *